(12) United States Patent
Wang et al.

(10) Patent No.: US 12,426,395 B2
(45) Date of Patent: Sep. 23, 2025

(54) PHOTOSENSITIVE ASSEMBLY AND MANUFACTURING METHOD THEREOF

(71) Applicant: NINGBO SUNNY OPOTECH CO., LTD., Yuyao (CN)

(72) Inventors: Wenjie Wang, Yuyao (CN); Mingzhu Wang, Yuyao (CN); Zhenyu Chen, Yuyao (CN)

(73) Assignee: NINGBO SUNNY OPOTECH CO., LTD., Yuyao (CN)

( * ) Notice: Subject to any disclaimer, the term of this patent is extended or adjusted under 35 U.S.C. 154(b) by 995 days.

(21) Appl. No.: 17/261,776

(22) PCT Filed: May 29, 2019

(86) PCT No.: PCT/CN2019/088953
§ 371 (c)(1),
(2) Date: Jan. 20, 2021

(87) PCT Pub. No.: WO2020/019863
PCT Pub. Date: Jan. 30, 2020

(65) Prior Publication Data
US 2021/0296389 A1    Sep. 23, 2021

(30) Foreign Application Priority Data

Jul. 23, 2018  (CN) .......................... 201810812766.8

(51) Int. Cl.
*H10F 39/00* (2025.01)
(52) U.S. Cl.
CPC ......... *H10F 39/811* (2025.01); *H10F 39/026* (2025.01); *H10F 39/804* (2025.01)
(58) Field of Classification Search
CPC ............................ H01L 27/146–14893; H01L 27/14643–14663; H01L 27/14618;
(Continued)

(56) References Cited

U.S. PATENT DOCUMENTS 10,134,687 B1 * 11/2018 Kim ...................... H01L 23/552
2008/0157312 A1    7/2008 Yang et al.
(Continued)

FOREIGN PATENT DOCUMENTS

CN       101211945 A      7/2008
CN       101232033 A      7/2008
(Continued)

OTHER PUBLICATIONS

International Search Report for PCT/CN2019/088953 mailed on Aug. 1, 2019.
(Continued)

*Primary Examiner* — Jonathan Han
(74) *Attorney, Agent, or Firm* — Birch, Stewart, Kolasch & Birch, LLP

(57) ABSTRACT

The present application provides a photosensitive assembly, comprising: a photosensitive chip, having a first surface and a second surface facing away from the first surface, the first surface having a photosensitive region; an electronic element arranged around the photosensitive chip; a molded portion formed by a molding process and packaging the electronic element and the photosensitive chip together, the molded portion having a third surface flush with the first surface; and a first re-wiring layer formed on a non-photosensitive region of the first surface and on the third surface, a pad of the photosensitive chip being electrically connected to the electronic element through the first re-wiring layer, wherein a side surface or a bottom surface of the photosensitive assembly has a conductive region, and the conductive region is electrically connected to the first re-wiring layer. The present application further provides a corresponding manufacturing method of photosensitive assembly. The present application can reduce design limitations of the (Continued)

photosensitive assembly; and make camera modules in mobile terminals more modularized and easy to replace.

16 Claims, 7 Drawing Sheets

(58) Field of Classification Search
CPC ..... H01L 27/14636; H01L 31/186–208; H01L 31/022408–022416; H01L 31/02005; H01L 31/02024–0203; H01L 21/0203; H01L 51/441; H01L 24/19–20; H01L 24/96; H01L 2224/19–225; H01L 2224/96; H01L 2224/2101; H01L 2224/2105; H01L 2224/211; H01L 2224/214; H01L 2224/73209; H01L 2224/73217; H01L 2224/73223; H01L 2224/73231; H01L 2224/73259; H01L 2224/73267; H01L 2224/73273; H01L 2224/73277; H01L 2224/73281; H01L 2224/24011; H01L 2224/2402; H01L 2224/02372; H01L 2224/023–024; H01L 2224/08225; H01L 2224/24195; H01L 2224/80006; H01L 2224/97; H01L 2224/08145; H01L 2224/05; H01L 2224/05558; H01L 2224/48463; H01L 2224/04042; H01L 25/065–0657; H01L 25/105; H01L 25/167; H01L 23/49811; H01L 23/5389; H01L 23/525; H01L 23/31; H01L 23/481; H01L 23/49816; H01L 23/528; H01L 23/5384; H01L 23/5226; H01L 23/5386; H01L 24/42; H01L 2924/15322; H01L 2924/15151; H01L 2924/15192; H01L 2924/19105; H01L 21/56; H01L 21/568; H01L 21/02019; H01L 21/30604–30621; H01L 21/3063–30635; H01L 21/3065–30655; H01L 21/31055–31056; H01L 21/31111–31122; H01L 21/31133–31138; H01L 21/32133–32139; H01L 21/465; H01L 21/31116; H01L 21/31122; H01L 21/31138; H01L 21/67069; H01L 21/32136–32137; H01L 21/02071; H01L 21/0273–0279; H01L 21/312–3128; H01L 21/0276; H01L 2225/06541; H01L 2224/80; H10K 30/87; H10K 30/88; G03F 7/004–115; G03F 7/12; G03F 7/16–18; G03F 7/70–70991; G03F 7/26–428; G03F 7/42–428; G03F 9/00–7096; H01J 37/3174–3177; H10F 39/811; H10F 39/026; H10F 39/804; H10F 39/80; H10F 39/12
See application file for complete search history.

(56) References Cited

U.S. PATENT DOCUMENTS

| | | |
|---|---|---|
| 2012/0286400 A1 | 11/2012 | Camacho et al. |
| 2013/0320471 A1 | 12/2013 | Luan |
| 2015/0262984 A1 | 9/2015 | Krabe et al. |
| 2016/0163755 A1 | 6/2016 | Huang et al. |
| 2016/0351618 A1* | 12/2016 | Vittu ............... H04N 23/54 |
| 2018/0083061 A1 | 3/2018 | Kim et al. |
| 2018/0090530 A1 | 3/2018 | Jeong et al. |
| 2018/0190558 A1 | 7/2018 | Hsu et al. |

FOREIGN PATENT DOCUMENTS

| | | | |
|---|---|---|---|
| CN | 101246897 A | 8/2008 | |
| CN | 102386196 A | 3/2012 | |
| CN | 103456754 A | 12/2013 | |
| CN | 103956371 A | 7/2014 | |
| CN | 106571377 A | 4/2017 | |
| CN | 107507821 A | 12/2017 | |
| CN | 107634078 A | 1/2018 | |
| CN | 109979951 A * | 7/2019 | ....... H01L 27/14634 |
| KR | 10-2009-0071367 A | 7/2009 | |
| WO | WO 2014/083750 A1 | 6/2014 | |

OTHER PUBLICATIONS

Extended European Search Report for European Application No. 19840529.2, dated Aug. 6, 2021.

* cited by examiner

PHOTOSENSITIVE ASSEMBLY AND MANUFACTURING METHOD THEREOF

CROSS REFERENCE TO RELATED APPLICATIONS

The present application claims the priority of Chinese patent application No. 201810812766.8, entitled "Photosensitive Assembly and Manufacturing Method Thereof" and filed with the Chinese Patent Office on Jul. 23, 2018, the entire content of which is incorporated herein by reference.

TECHNICAL FIELD

The present application relates to the technical field of optics. Specifically, the present application relates to a photosensitive assembly and a manufacturing method thereof.

BACKGROUND

At present, the camera module in the industry is becoming more and more miniaturized to meet the requirements of integration and miniaturization of smart terminals. However, at present, one of the important obstacles to the miniaturization of the camera module is the printed circuit board. For the current printed circuit board technology, it is already close to its achievable limit and can no longer meet the demand for more miniaturization.

In order to meet the current demand for miniaturization in the industry, the applicant proposed a solution of electrically connecting the photosensitive chip of the camera module and the electronic components together through a fan-out packaging technology (fan-out packaging). This solution replaces the circuit board in the conventional camera module through the fan-out packaging, thereby further promoting the miniaturization of the camera module.

However, the current camera module usually needs to connect the camera module with the mobile terminal through a flexible connection belt and a connector, so it is necessary to set a region on the fan-out package for electrical connection with the flexible connection belt. Nevertheless, if it is necessary to connect the flexible connection belt, the top or bottom layer of the photosensitive assembly of the fan-out packaged camera module must be an RDL layer, so that the solder joints are extended for the flexible connection belt to be electrically connected. This also imposes certain restrictions on the structural design of the fan-out package, and a certain avoidance design is bound to be produced while electrically connecting the flexible connection belt. In addition, in order to dispose the flexible connection belt, the size of the camera module is increased, which is contrary to the miniaturization development of the industry.

On the other hand, existing mobile terminals are also developing towards high concentration, resulting in narrower regions set for camera modules in mobile terminals. When a camera module is disposed in a mobile terminal through a flexible connection belt, the flexible connection belt may need to be bent in a relatively large extent to be connected to the mobile terminal, which also increases the reliability requirements of the camera module on the flexible connection belt to ensure that the flexible connection belt will not be damaged due to multiple bending. Therefore, the current connection manner of the conventional flexible connection belt has not satisfied the current industry development, and has even produced certain obstacles.

Therefore, there is an urgent need for solutions that can overcome the above-mentioned shortcomings.

SUMMARY

The present application is intended to provide a solution that can overcome at least one shortcoming of the prior art.

According to an aspect of the present application, there is provided a photosensitive assembly, comprising: a photosensitive chip having a first surface and a second surface facing away from the first surface, the first surface having a photosensitive region and a non-photosensitive region, and the photosensitive chip further having a pad disposed in the non-photosensitive region; an electronic element arranged around the photosensitive chip; a molded portion formed by a molding process and packaging the electronic element and the photosensitive chip together, the molded portion having a third surface flush with the first surface; and a first re-wiring layer formed on the non-photosensitive region of the first surface and on the third surface, the pad being electrically connected to the electronic element through the first re-wiring layer, is wherein a side surface or a bottom surface of the photosensitive assembly has a conductive region, and the conductive region is electrically connected to the first re-wiring layer.

Herein, the molded portion is a molded layer, and the molded layer covers the second surface to form a fourth surface facing away from the third surface; wherein the photosensitive assembly further comprises: a conductive core body arranged around the photosensitive chip; and a second re-wiring layer formed on the fourth surface, wherein the molded layer is formed by a molding process and fixes the conductive core body, the electronic element and the photosensitive chip together, the conductive core body electrically connects the first re-wiring layer and the second re-wiring layer, the pad is electrically connected to the conductive core body through the first re-wiring layer, and the conductive core body is electrically connected to the electronic element through the second re-wiring layer.

Herein, a side surface of the molded portion has a conductive region and the conductive region is electrically connected to the first re-wiring layer; and the conductive region is further electrically connected to the second re-wiring layer.

Herein, the conductive region is formed by cutting a conductive pillar disposed on a boundary between two adjacent photosensitive assemblies.

Herein, the conductive region is formed on a lower surface of the second re-wiring layer by a solder ball array or a conductive pillar array.

Herein, a re-wiring line of the first re-wiring layer extends to an edge of the first re-wiring layer and is exposed on a side surface of the first re-wiring layer; and the conductive region is formed by plating a metal layer on the side surface of the molded portion and the side surface of the first re-wiring layer.

Herein, a re-wiring line of the second re-wiring layer extends to an edge of the second re-wiring layer and is exposed on a side surface of the second re-wiring layer; and the conductive region is formed by plating a metal layer on the side surface of the molded layer and the side surface of the second re-wiring layer.

According to another aspect of the present application, there is further provided another photosensitive assembly, comprising: a photosensitive chip having a first surface and a second surface facing away from the first surface, the first surface having a photosensitive region and a non-photosensitive region, and the photosensitive chip further having a pad disposed in the non-photosensitive region; an electronic element arranged around the photosensitive chip; a molded layer formed by a molding process and fixing the electronic element and the photosensitive chip together, the molded layer having a third surface flush with the first surface, and the molded layer covering the second surface to form a fourth surface facing away from the third surface; a first re-wiring layer formed on the non-photosensitive region of the first surface and on the third surface, the pad being electrically connected to the electronic element through the first re-wiring layer; and a conductive core body penetrating the molded layer, one end of the conductive core body being electrically connected to the electronic element and the pad through the first re-wiring layer, and the other end being exposed on the fourth surface to form a conductive region.

According to another aspect of the present application, there is further provided a manufacturing method of photosensitive assembly, comprising: 1) manufacturing a photosensitive assembly spliced board, the photosensitive assembly spliced board being composed of at least two photosensitive assembly units, the photosensitive assembly unit comprising: a photosensitive chip having a first surface and a second surface facing away from the first surface, the first surface having a photosensitive region and a non-photosensitive region, and the photosensitive chip further having a pad disposed in the non-photosensitive region; an electronic element arranged around the photosensitive chip; a molded layer formed by a molding process and packaging the electronic element and the photosensitive chip together, the molded layer having a third surface flush with the first surface; and a first re-wiring layer formed on the non-photosensitive region of the first surface and on the third surface, the pad being electrically connected to the electronic element through the first re-wiring layer, wherein the molded layers of two adjacent photosensitive assembly units are connected to form a whole, and a conductive pillar is provided at a position of a boundary of the two adjacent photosensitive assembly units, the conductive pillar being wrapped in the molded layers forming a whole; and 2) cutting the photosensitive assembly spliced board at the boundary, so that the conductive pillar is cut open, and thereby a side surface of the molded layer of the photosensitive assembly obtained by cutting has the conductive region.

Herein, the step 1) comprises: 11) forming a first re-wiring layer corresponding to at least two photosensitive chips on a bearing plate; 12) disposing at least two photosensitive chips and corresponding electronic elements, as well as a conductive pillar located between two adjacent photosensitive chips on the first re-wiring layer, wherein both the electronic element and the conductive pillar are electrically connected to the pad of the photosensitive chip through the first re-wiring layer; and 13) fixing the first re-wiring layer, the at least two photosensitive chips, the electronic elements and the conductive pillar together by a molding process to form the photosensitive assembly spliced board.

Herein, in the step 11), the first re-wiring layer has a light-passing hole forming region corresponding to the photosensitive region, and no wiring is performed in the light-passing hole forming region; and the manufacturing method of photosensitive assembly further comprises a step of: 3) removing the light-passing hole forming region from the first re-wiring layer.

Herein, the step 3) is executed after the step 2); or between the step 13) and the step 2); or between the step 11) and the step 12).

Herein, in the step 12), the conductive pillar is in contact with a planting ball disposed at an interface of the first re-wiring layer and the molded layer.

Herein, the step 12) further comprises disposing a conductive core body on the first re-wiring layer; the step 13) further comprises molding the conductive core body and the first re-wiring layer, the photosensitive chip and the electronic element together; and the step 1) further comprises a sub-step of: 14) forming a second re-wiring layer on a surface of the molded layer formed in step 13) facing away from the bearing plate to form the photosensitive assembly spliced board.

According to another aspect of the present application, there is further provided another manufacturing method of photosensitive assembly, comprising: 1) manufacturing the photosensitive assembly according to any one of claims 2-3, wherein a part of a re-wiring layer of the photosensitive assembly extends to an edge of the re-wiring layer, and is exposed on a side surface of the re-wiring layer, and wherein the re-wiring layer is the first re-wiring layer or the second re-wiring layer; and 2) forming the conductive region by plating a metal layer on a side surface of the molded layer and the side surface of the re-wiring layer.

Herein, the step 1) comprises the following sub-steps: 11) forming a first re-wiring layer corresponding to a photosensitive chip on a bearing plate; 12) disposing the photosensitive chip and a corresponding electronic element on the first re-wiring layer, wherein the electronic element is electrically connected to a pad of the photosensitive chip through the first re-wiring layer; and 13) is fixing the first re-wiring layer, the photosensitive chip and the electronic element together by a molding process.

Herein, in the step 11), the bearing plate has a blank region corresponding to the photosensitive region of the photosensitive chip thereon, and the blank region is not covered by the first re-wiring layer.

Herein, in the step 11), the first re-wiring layer has a light-passing hole forming region corresponding to the photosensitive region of the photosensitive chip, and no wiring is performed in the light-passing hole forming region; and the manufacturing method of photosensitive assembly further comprises a step of: 3) removing the light-passing hole forming region.

Herein, in the step 11), a part of a re-wiring line of the first re-wiring layer extends to an edge of the first re-wiring layer, and is exposed on a side surface of the first re-wiring layer; and in the step 2), the conductive region is formed by plating a metal layer on a side surface of the molded layer and the side surface of the first re-wiring layer.

Herein, the step 12) further comprises disposing a conductive core body on the first re-wiring layer; the step 13) further comprises molding the conductive core body and the first re-wiring layer, the photosensitive chip and the electronic element together; and the step 1) further comprises a sub-step of: 14) forming a second re-wiring layer on a surface of the molded layer formed in step 13) facing away from the bearing plate.

Herein, in the step 14), a part of a re-wiring line of the second re-wiring layer extends to an edge of the second re-wiring layer, and is exposed on a side surface of the second re-wiring layer; and in the step 2), the conductive region is formed by plating a metal layer on a side surface of the molded layer and the is side surface of the second re-wiring layer.

Herein, the step 1) comprises: by a molding process, packaging the at least two photosensitive chips, the electronic elements and the conductive pillar arranged on a bearing plate at preset positions together, and then arranging a re-wiring layer on a surface of a package body formed after molding to obtain the photosensitive assembly spliced board.

Herein, the step 1) comprises: 11) arranging at least two photosensitive chips, electronic elements and the conductive pillar on a bearing plate; 12) fixing the at least two photosensitive chips, the electronic elements and the conductive pillar together by a molding process to form one package body; and 13) disposing a first re-wiring layer on the package body, so that the electronic elements and the conductive pillar are each electrically connected to the pad of the respective photosensitive chip through the first re-wiring layer to obtain the photosensitive assembly spliced board.

Herein, in the step 13), the conductive pillar is in contact with a planting ball disposed at an interface of the first re-wiring layer and the molded layer.

Herein, in the step 13), the first re-wiring layer has a light-passing hole forming region corresponding to the photosensitive region, and no wiring is performed in the light-passing hole forming region; and the manufacturing method of photosensitive assembly further comprises a step of: 3) removing the light-passing hole forming region.

Herein, the step 3) is executed between the step 13) and the step 2), or after the step 2).

Compared with the prior art, the present application has at least one of the is following technical effects:

1. In the present application, a structure without connection belt can be adopted, so that the design limitation of the fan-out packaged photosensitive assembly is reduced, and thereby the design is more flexible.

2. In the present application, contact electrical connection on the side surface of the photosensitive assembly can be realized, so that the camera module is more compact.

3. In the present application, an electrical connection region can be set on the side surface of the base of the camera module, which is integrated with the base and is not easily damaged.

4. In the present application, the contact electrical connection on the side surface of the base can be used to make the connection between the camera module and the mobile terminal easier and more convenient, and the camera module can be easily replaced, which makes the camera module more modularized.

BRIEF DESCRIPTION OF THE DRAWINGS

The exemplary embodiments are shown in the reference drawings. The embodiments and drawings disclosed herein are to be considered illustrative and not restrictive.

DETAILED DESCRIPTION

Figure 1:
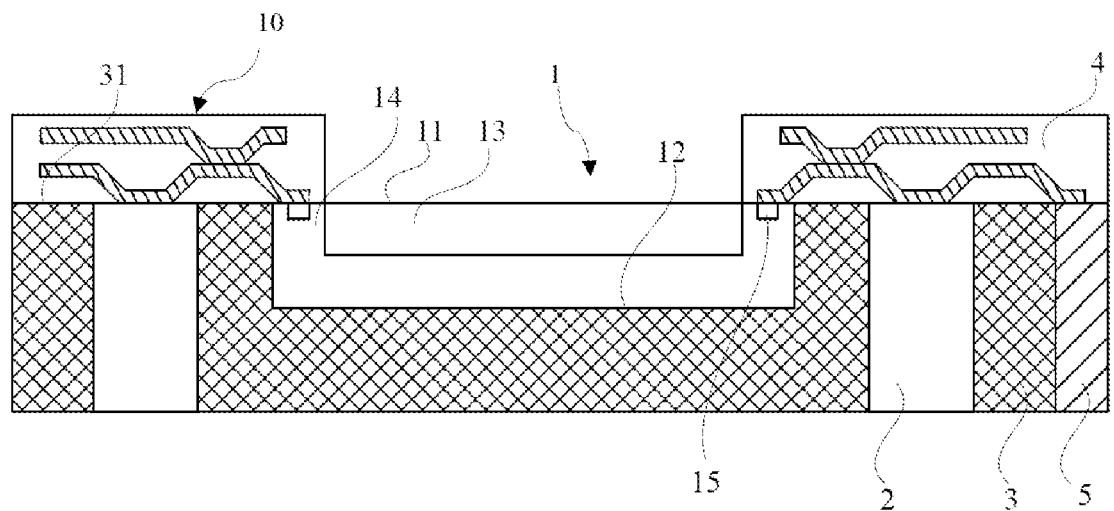
FIG. 1 shows a schematic cross-sectional view of a photosensitive assembly 10 according to an embodiment of the present application.

In order to better understand the present application, various aspects of the present application will be described in more detail with reference to the drawings. It should be understood that the detailed description is merely depiction of exemplary embodiments of the present application, and does not limit the scope of the present application in any way. Throughout the description, is the same reference numerals refer to the same elements. The expression "and/or" includes any and all combinations of one or more of the associated listed items.

It should be noted that in the present description, the expressions of "first", "second", etc. are only used to distinguish one feature from another feature, and do not indicate any limitation on the feature. Therefore, without departing from the teachings of the present application, a first main body discussed below may also be referred to as a second main body.

In the drawings, for convenience of explanation, the thickness, size, and shape of the object have been slightly exaggerated. The drawings are only examples and are not drawn strictly to scale.

It should also be understood that the terms "comprising", "comprise", "having", "including" and/or "include" when used in the present description, indicate the existence of stated features, integers, steps, operations, elements and/or components, but does not exclude the presence or addition of one or more other features, integers, steps, operations, elements, components and/or combinations thereof. Furthermore, when an expression such as "at least one of" appears after the list of listed features, it modifies the entire list of listed features, rather than the individual elements in the list. In addition, when describing the implementations of the present application, the use of "may" means "one or more implementations of the present application", and, the term "exemplary" refers to an example or exemplary illustration.

As used herein, the terms "substantially", "approximately" and similar terms are used as a term expressing an approximation and not as a term expressing an extent, and are intended to indicate an inherent deviation in a measurement value or calculated value, which will be recognized by those of ordinary skill in is the art.

Unless otherwise defined, all terms (including technical and scientific terms) used herein have the same meanings as commonly understood by those of ordinary skill in the art to which the present application belongs. It should also be understood that the terms (such as those defined in commonly used dictionaries) should be interpreted to have meanings consistent with their meaning in the context of the relevant art and will not be interpreted in an idealized or overly formal sense unless it is clearly defined herein.

It needs to be explained that, in the case of no conflict, the embodiments in the present application and the features in the embodiments can be combined with each other. The present application will be described in detail below in conjunction with embodiments with reference to the drawings.

Figure 2:
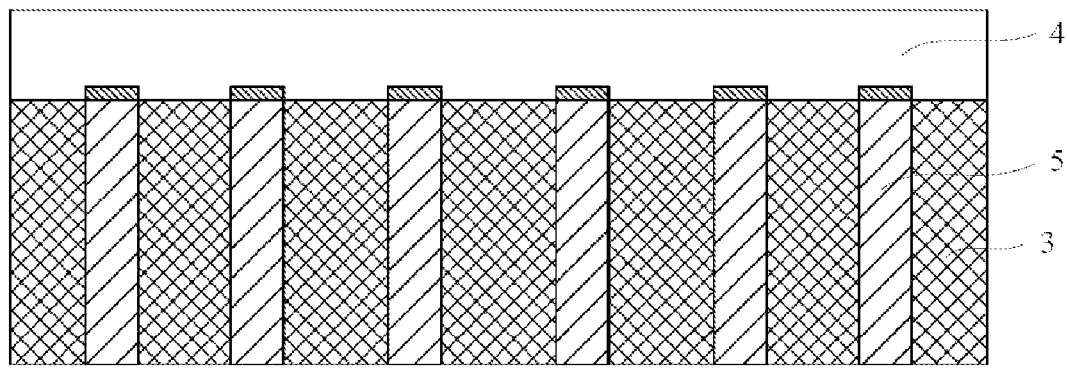
FIG. 2 shows a schematic side view of the photosensitive assembly 10 shown in FIG. 1.

FIG. 1 shows a schematic cross-sectional view of a photosensitive assembly 10 according to an embodiment of the present application. Referring to FIG. 1, the photosensitive assembly 10 includes: a photosensitive chip 1, an electronic element 2, a molded layer 3 and a first re-wiring layer 4. A photosensitive chip 1 has a first surface 11 and a second surface 12 facing away from the first surface 11, the first surface 11 has a photosensitive region 13 and a non-photosensitive region 14, and the photosensitive chip 1 further has a pad 15 (e.g. a solderjoint) disposed in the non-photosensitive region 14. The electronic element 2 is arranged around the photosensitive chip 1. The molded layer 3 is formed by a molding process and packages the electronic element 2 and the photosensitive chip 1 together, and the molded layer 3 has a third surface 31 flush with the first surface 11. The first re-wiring layer 4 is formed on the non-photosensitive region 14 of the first surface 11 and on the third surface 31, and the pad 15 is electrically connected to the electronic element 2 through the first re-wiring layer 4. FIG. 2 shows a schematic side view of the photosensitive assembly 10 shown in FIG. 1. As shown in FIG. 2, a side surface of the molded layer 3 has a conductive region 5 and the conductive region 5 is electrically connected to the first re-wiring layer 4.

Figure 3:
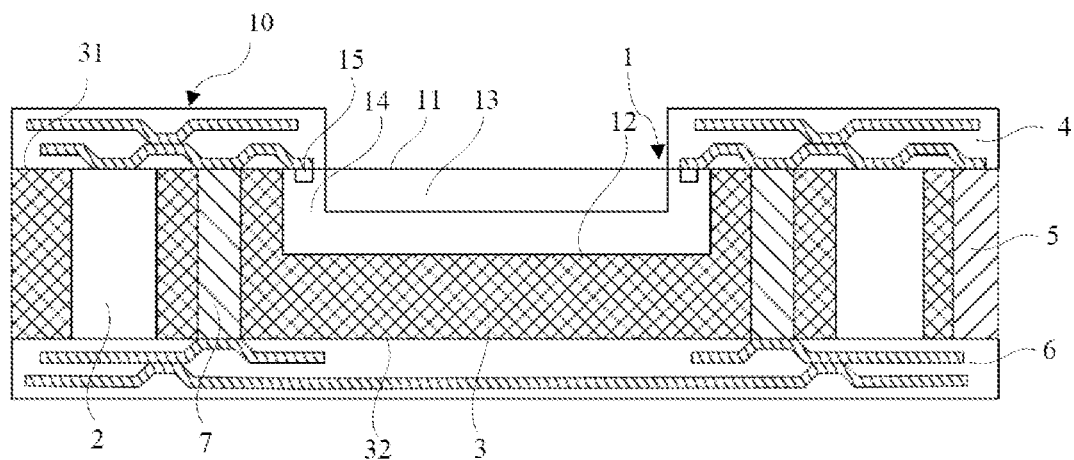
FIG. 3 shows a schematic cross-sectional view of a photosensitive assembly 10 according to another embodiment of the present application.

Further, FIG. 3 shows a schematic cross-sectional view of a photosensitive assembly 10 according to another embodiment of the present application.

Referring to FIG. 3, in this embodiment, the molded layer 3 covers the second surface 12 to form a fourth surface 32 facing away from the third surface 31.

The photosensitive assembly 10 further includes a conductive core body 7 and a second re-wiring layer 6. The conductive core body 7 is arranged around the photosensitive chip 1, and the second re-wiring layer 6 is formed on the fourth surface 32. The molded layer 3 is formed by a molding process and fixes the conductive core body 7, the electronic element 2 and the photosensitive chip 1 together, the conductive core body 7 electrically connects the first re-wiring layer 4 and the second re-wiring layer 6, the pad 15 is electrically connected to the conductive core body 7 through the first re-wiring layer 4, and the conductive core body 7 is electrically connected to the electronic element 2 through the second re-wiring layer 6. The conductive region 5 is electrically connected to the first re-wiring layer 4 through the second re-wiring layer 6 and the conductive core body 7.

In an embodiment, the conductive region 5 is formed by cutting a conductive pillar 51 disposed on a boundary between two adjacent photosensitive assemblies 10.

In another embodiment, a re-wiring line of the first re-wiring layer 4 extends to an edge of the first re-wiring layer 4 and is exposed on a side surface of the first re-wiring layer 4; and the conductive region 5 is formed by plating a metal layer on a side surface of the molded layer 3 and a side surface of the first re-wiring layer 4.

In another embodiment, a re-wiring line of the second re-wiring layer 6 extends to an edge of the second re-wiring layer 6 and is exposed on a side surface of the second re-wiring layer 6; and the conductive region 5 is formed by plating a metal layer on a side surface of the molded layer 3 and a side surface of the second re-wiring layer 6.

In the above embodiments, the circuit of the photosensitive assembly can be extended through the re-wiring layer (RDL=Re-Distribution Layer), which can facilitate the electrical connection between the camera module and the mobile terminal, but the spacing between the corresponding respective conductive regions needs to be set to prevent mutual interference.

Moreover, in the above embodiments, the conductive regions can be distributed around a camera module base (the photosensitive assembly can be regarded as the base of the camera module), and when the required conductive regions (or the input and output terminals required by the photosensitive assembly) are too many to be arranged on the same side surface, it is appropriate to set the conductive regions on two or more side surfaces of the camera module base.

Of course, in an embodiment, they can be set on the same side surface, so as to reduce the circuit setting on the mobile terminal.

Figure 4:
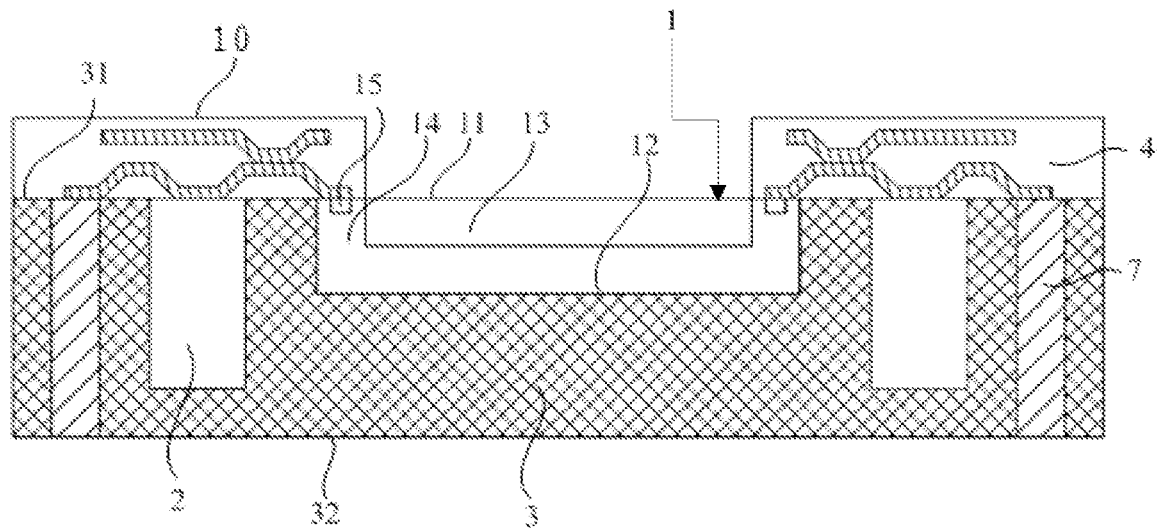
FIG. 4 shows a schematic cross-sectional view of a photosensitive assembly 10 according to still another embodiment of the present application.

Further, FIG. 4 shows a schematic cross-sectional view of a photosensitive assembly 10 according to still another embodiment of the present application.

Figure 5A:
FIG. 5a shows a schematic bottom view of the photosensitive assembly 10 shown in FIG. 4.

In this embodiment, the conductive region 5 of the photosensitive assembly 10 is set at the bottom. Referring to FIG. 4, the photosensitive assembly 10 includes: a photosensitive chip 1, an electronic element 2, a molded layer 3, a first re-wiring layer 4 and a conductive core body 7. A photosensitive chip 1 has a first surface 11 and a second surface 12 facing away from the first surface 11, the first surface 11 has a photosensitive region 13 and a non-photosensitive region 14, and the photosensitive chip 1 further has a pad 15 disposed in the non-photosensitive region 14. The electronic element 2 is arranged around the photosensitive chip 1. The molded layer 3 is formed by a molding process and fixes the electronic element 2 and the photosensitive chip 1 together, the molded layer 3 has a third surface 31 flush with the first surface 11, and the molded layer 3 covers the second surface 12 to form a fourth surface 32 facing away from the third surface 31. The first re-wiring layer 4 is formed on the non-photosensitive region 14 of the first surface 11 and on the third surface 31, and the pad 15 is electrically connected to the electronic element 2 through the first re-wiring layer 4. The conductive core body 7 penetrates the molded layer 3, one end of the conductive core body 7 is electrically connected to the electronic element 2 and the pad 15 through the first re-wiring layer 4, and the other end is exposed on the fourth surface 32 to form a conductive region 5. FIG. 5a shows a schematic bottom view of the photosensitive assembly 10 shown in FIG. 4. It can be seen from FIG. 5a that, in this embodiment, the conductive regions 5 of the photosensitive assembly 10 are distributed on the fourth surface 32 at the bottom. In this embodiment, the conductive pillars 51 are all disposed inside the module.

Figure 5B:
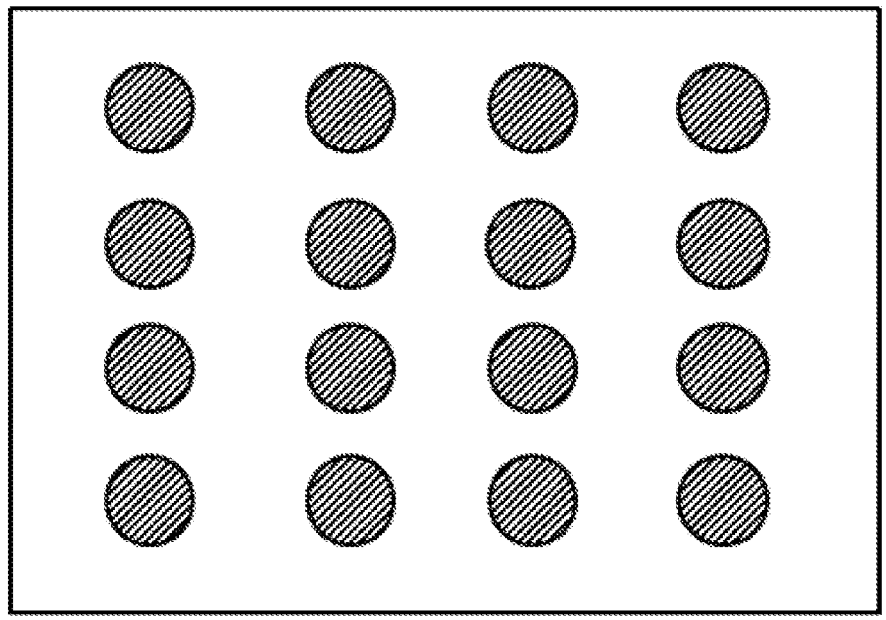
FIG. 5b shows a schematic bottom view of a photosensitive assembly according to another embodiment of the present application.

Further, FIG. 5b shows a schematic bottom view of a photosensitive assembly according to another embodiment of the present application. In this embodiment, the schematic cross-sectional view of the photosensitive assembly is consistent with FIG. 3. Referring to FIG. 5b, in this embodiment, the conductive regions 5 are distributed on a lower surface of the second re-wiring layer 6 located at the bottom. The conductive region 5 may be formed by an array of exposed solder balls or an array of conductive pillars. In this embodiment, a contact electrical connection with other components of the terminal device (such as a main board) can be realized on the bottom surface of the photosensitive assembly.

In the above embodiment, the photosensitive assembly may be used for AF camera modules, or may be used for FF camera modules. Moreover, the camera module may be an ordinary single camera, and may be expanded to be used in a dual camera or array module. The conductive region may be a conductive pillar, or may be a conductive layer.

Figure 6A:
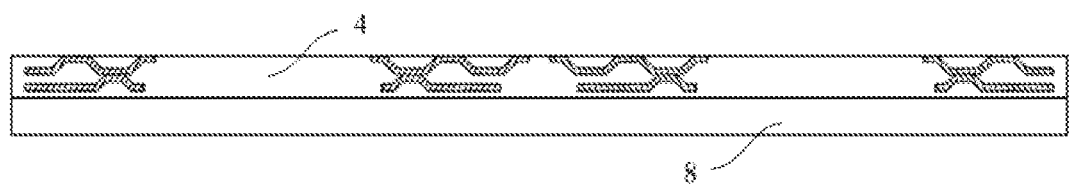
FIGS. 6a to 6g show a process for manufacturing a photosensitive assembly 10 in an embodiment of the present application.
Figure 6B:
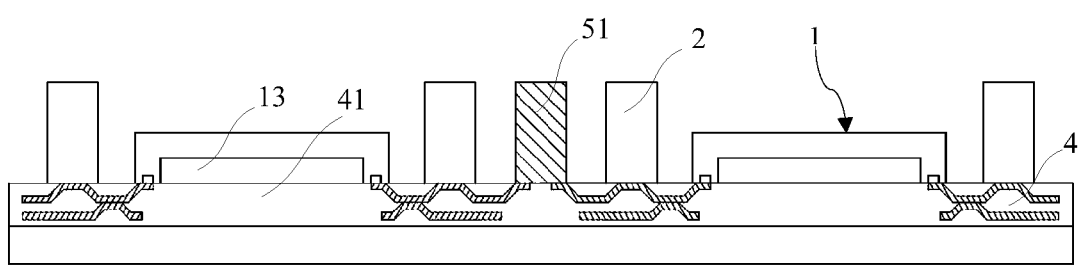
Figure 6C:
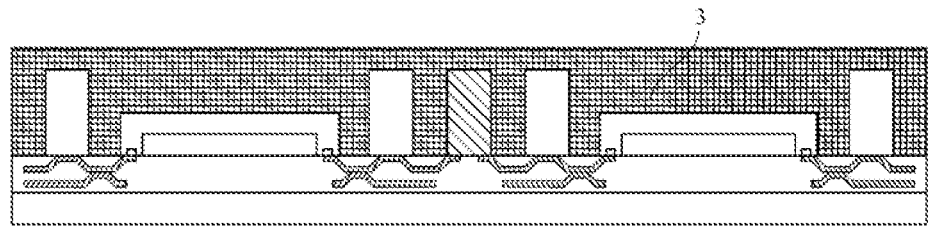
Figure 6D:
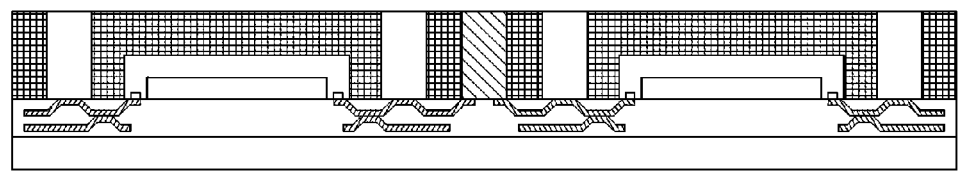
Figure 6E:
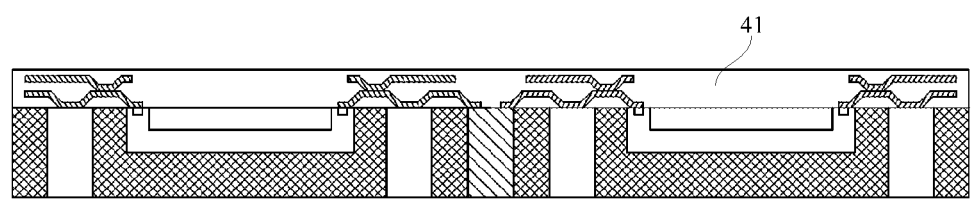
Figure 6F:
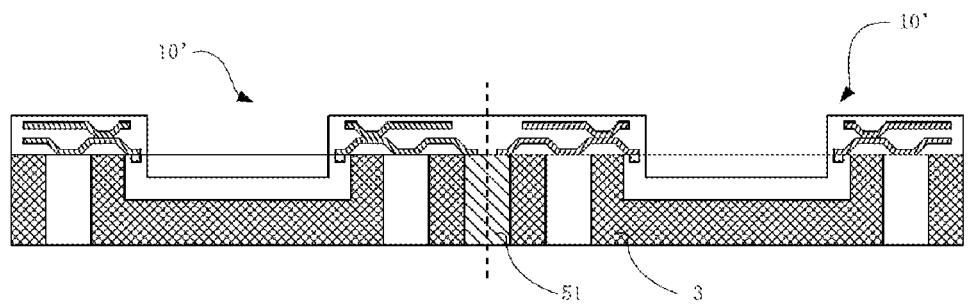

Further, FIGS. 6a to 6g show a process for manufacturing a photosensitive assembly 10 in an embodiment of the present application. Referring to FIGS. 6a to 6g, the method for manufacturing the photosensitive assembly 10 of this embodiment includes steps 100 to 200: Step 100, manufacturing a photosensitive assembly spliced board. FIG. 6f shows an example of a finished photosensitive assembly spliced board in an embodiment of the present application. The photosensitive assembly spliced board is composed of at least two photosensitive assembly units 10', wherein molded layers 3 of two adjacent photosensitive assembly units 10' form a whole, and a conductive pillar 51 is provided at a position of a boundary of the two adjacent photosensitive assembly units, the conductive pillar 51 being wrapped in the molded layers 3 forming a whole.

In an embodiment, step 100 includes the following substeps: Step 101, forming a first re-wiring layer 4 corresponding to at least two photosensitive chips 1 on a bearing plate 8. In an example, the first re-wiring layer 4 has a light-passing hole forming region 41 corresponding to the photosensitive region 13, and no wiring is performed in the light-passing hole forming region 41. FIG. 6a shows an example of forming a first re-wiring layer 4 corresponding to two photosensitive chips on a bearing plate 8 in an embodiment of the present application.

Step 102, disposing at least two photosensitive chips 1 and corresponding electronic elements 2, as well as a conductive pillar 51 located between two adjacent photosensitive chips 1 on the first re-wiring layer 4, wherein both the electronic element 2 and the conductive pillar 51 are electrically connected to the pad 15 of the photosensitive chip 1 through the first re-wiring layer 4. The conductive pillar 51 is in contact with a planting ball disposed at an interface of the first re-wiring layer 4 and the molded layer 3. FIG. 6b shows an example of disposing at least two photosensitive chips 1 and corresponding electronic elements 2, as well as a conductive pillar 51 located between two adjacent photosensitive chips 1 on the first re-wiring layer 4 in an embodiment of the present application.

Step 103, fixing the first re-wiring layer 4, the at least two photosensitive chips 1, the electronic elements 2, and the conductive pillar 51 together by a molding process. FIG. 6c shows an example of fixing the first re-wiring layer 4, the at least two photosensitive chips 1, the electronic elements 2, and the conductive pillar 51 together by a molding process in an embodiment of the present application. In an embodiment, after the molding is completed, the molded layer 3 can be ground so that the conductive pillar 51 is exposed and the molded layer 3 is thinned, the height of the thinned molded layer 3 being equal to or greater than that of the electronic element 2 (the height of the electronic element 2 is generally higher than the height of the photosensitive chip 1). FIG. 6d shows an example of grinding the molded layer 3 in an embodiment of the present application. Further, the bearing plate 8 may be peeled off to obtain a photosensitive assembly spliced board. FIG. 6e shows an example of the photosensitive assembly spliced board after the bearing plate 8 is peeled off in an embodiment of the present application. Further, in an embodiment, the light-passing hole forming region 41 of the first re-wiring layer 4 may also be removed. FIG. 6f shows an example of the photosensitive assembly spliced board after the light-passing hole forming region 41 of the first re-wiring layer 4 is removed in an embodiment of the present application.

Figure 6G:
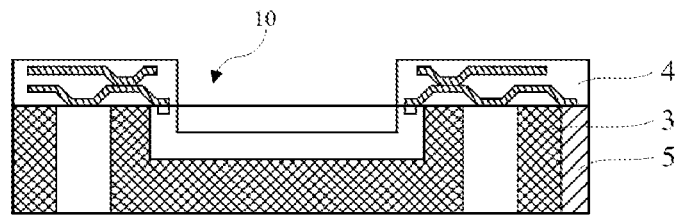

Step 200, cutting the photosensitive assembly spliced board at the boundary, so that the conductive pillar 51 is cut open, and thereby a side surface of the molded layer 3 of the photosensitive assembly 10 obtained by cutting has the conductive region 5. FIG. 6g shows an example of the photosensitive assembly obtained by cutting the photosensitive assembly spliced board in an embodiment of the present application.

Further, in an embodiment, removing the light-passing hole forming region 41 of the first re-wiring layer 4 may also be executed after step 200. That is, after the photosensitive assembly spliced board shown in FIG. 6e is obtained, step 200 is directly executed. Then, a step of removing the light-passing hole forming region 41 of the first re-wiring layer 4 is executed. Of course, in another embodiment, the step of removing the light-passing hole forming region 41 of the first re-wiring layer 4 may also be executed between step 101 and step 102, so that the first re-wiring layer 4 does not completely cover the bearing plate 8. That is to say, after removing the light-passing hole forming region 41, the bearing plate 8 has a blank region thereon, the blank region corresponding to the photosensitive region 13 of the photosensitive chip 1, and the blank region being not covered by the first re-wiring layer 4.

The embodiment corresponding to steps 100-200 described above is suitable for the entire imposition process. In the embodiment, the RDL layer and the molded layer 3 between the two photosensitive chips 1 can be provided with a longer conductive region 5, so that after cutting, the exposed conductive region can still be obtained on the side surface of the camera module, and the conductive region 5 and the RDL layer can still be electrically connected. In another embodiment, the bearing plate 8 may not be removed in step 103, but the bearing plate 8 is removed after step 200 is completed.

In another example, in step 101, the first re-wiring layer 4 has a light-passing hole forming region 41 corresponding to the photosensitive region 13, and no wiring is performed in the light-passing hole forming region 41.

The method for manufacturing the photosensitive assembly 10 further includes: Step 300: removing the light-passing hole forming region 41 of the first re-wiring layer 4. Step 300 may be executed after step 200, or may be executed after step 103 and before step 200. The first re-wiring layer 4 does not completely cover the bearing plate 8. The bearing plate 8 has a blank region thereon, the blank region corresponding to the photosensitive region 13 of the photosensitive chip 1, and the blank region being not covered by the first re-wiring layer 4.

Further, FIGS. 7a to 7g show a process for manufacturing a photosensitive assembly 10 in another embodiment of the present application. In this embodiment, when the photosensitive assembly spliced board is manufactured, molding can be first performed, the at least two photosensitive chips 1, the electronic elements 2 and the conductive pillar 51 are packaged together, and then a re-wiring layer (e.g. the first re-wiring layer 4) is formed on a surface of the resulting package body. The method for manufacturing the photosensitive assembly 10 of this embodiment includes the following steps: Step 110: arranging at least two photosensitive chips 1, electronic elements 2 and a conductive pillar 51 on the bearing plate 8 according to preset positions.

Figure 7A:
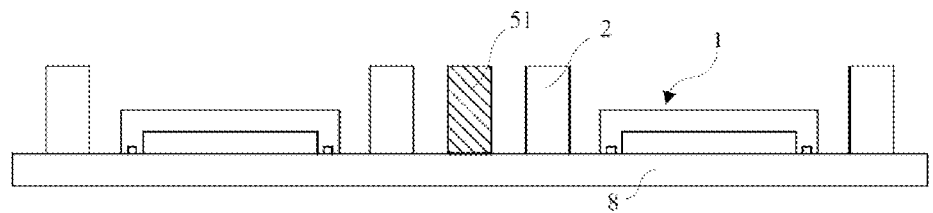
FIGS. 7a to 7g show a process for manufacturing a photosensitive assembly 10 in another embodiment of the present application.
Figure 7B:
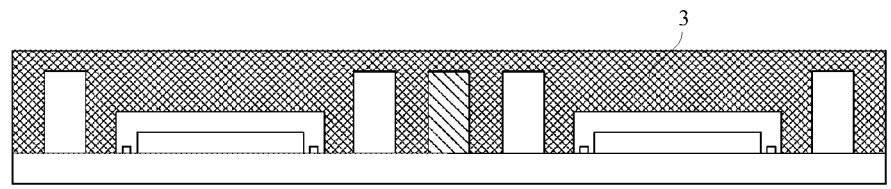

FIG. 7a shows an example of arranging the two photosensitive chips 1, the electronic elements 2 and the conductive pillar 51 on a bearing plate 8 in an embodiment of the present application. In this embodiment, the at least two photosensitive chips 1, the electronic elements 2, and the conductive pillar 51 arranged on the bearing plate 8 correspond to at least two photosensitive assembly units. Moreover, the conductive pillar 51 is provided at a position of a boundary between the two adjacent photosensitive assembly units.

Step 120: fixing the at least two photosensitive chips 1, the electronic elements 2 and the conductive pillar 51 together by a molding process to form one package body. FIG. 7a shows an example of arranging the two photosensitive chips 1, the electronic elements 2 and the conductive pillar 51 on a bearing plate 8 in an embodiment of the present application. The package body has a molded layer 3 therein.

Figure 7C:
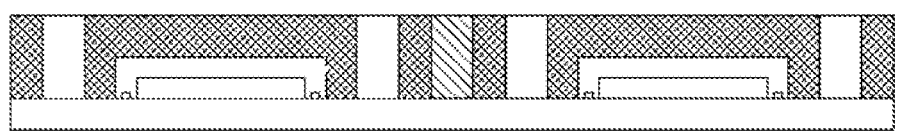

Step 130: grinding the molded layer 3 of the package body, so that the conductive pillar 51 is exposed and the molded layer 3 is thinned. FIG. 7c shows an example of a package body after grinding in an embodiment of the present application.

Figure 7D:
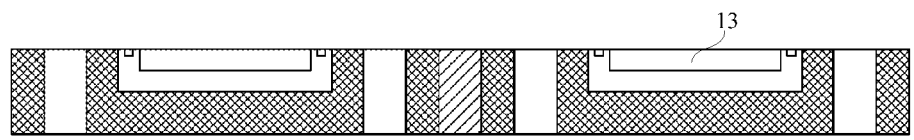

Step 140: removing the bearing plate 8. FIG. 7d shows an example of the package body after removing the bearing plate 8 in an embodiment of the present application. In FIG. 7d, after the bearing plate 8 is removed, the package body is turned over so that the photosensitive region 13 of the photosensitive chip 1 is placed upward.

Figure 7E:
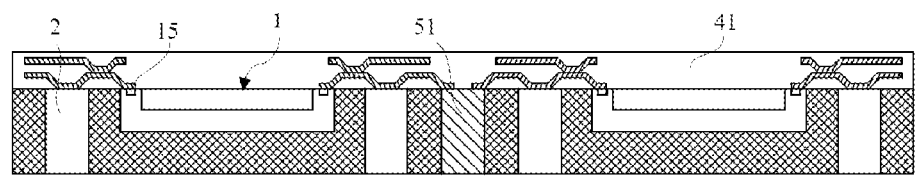

Step 150: forming a first re-wiring layer 4 on an upper surface of the package body, so that the electronic elements 2 and the conductive pillars 51 are all electrically connected to a pad 15 of the photosensitive chip 1 through the first re-wiring layer 4. The conductive pillar 51 is in contact with a planting ball disposed at an interface of the first re-wiring layer 4 and the molded layer 3. FIG. 7e shows an example of forming the first re-wiring layer 4 on a surface of the package body in an embodiment of the present application. The first re-wiring layer 4 has a light-passing hole forming region 41 corresponding to the photosensitive region 13, and no wiring is performed in the light-passing hole forming region 41.

Figure 7F:
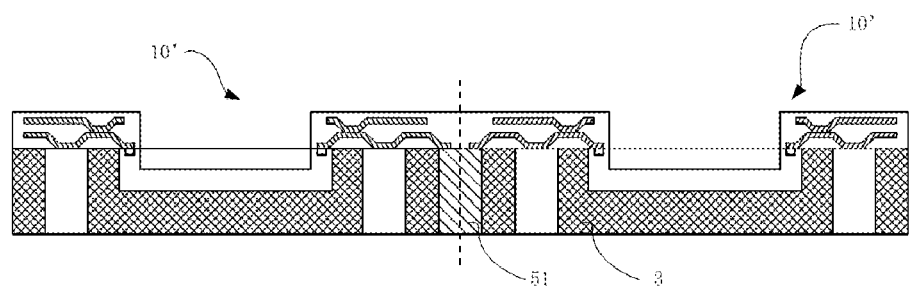

Step 160: removing the light-passing hole forming region 41 of the first re-wiring layer 4 so as to expose the photosensitive region 13. FIG. 7f shows an example of a photosensitive assembly spliced board after removing the light-passing hole forming region 41 in an embodiment of the present application.

Figure 7G:
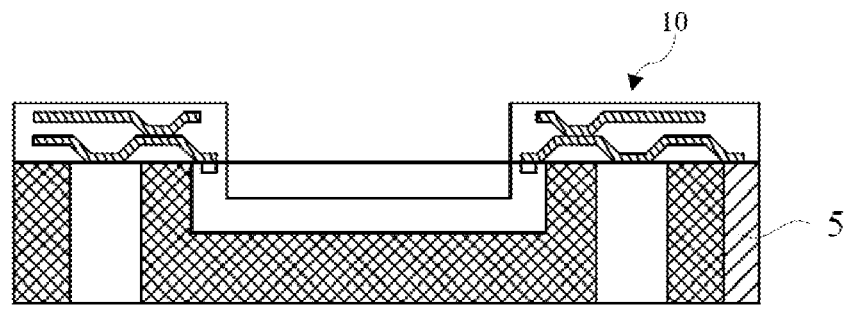

Step 170: cutting the photosensitive assembly spliced board to obtain a monolithic photosensitive assembly 10. FIG. 7g shows an example of a monolithic photosensitive assembly 10 in an embodiment of the present application. The conductive pillar 51 at the boundary between two photosensitive assembly units is cut open to form a conductive region 5 located on a side surface of the monolithic photosensitive assembly 10. In another embodiment, the execution orders of step 160 and step 170 can be interchanged.

Further, FIGS. 8a to 8e show a process for manufacturing a photosensitive assembly 10 in still another embodiment of the present application. Referring to FIGS. 8a to 8e, the method for manufacturing the photosensitive assembly 10 of this embodiment includes steps 1000 to 2000:

Step 1000, manufacturing a photosensitive assembly 10, wherein a part of a re-wiring line of a re-wiring layer of the photosensitive assembly 10 extends to an edge of the re-wiring layer and is exposed on a side surface of the re-wiring layer, and wherein the re-wiring layer may be the first re-wiring layer 4 or the second re-wiring layer 6.

Step 2000, forming a conductive region 5 by plating a metal layer on the side surface of the molded layer 3 and the side surface of the re-wiring layer to obtain a finished photosensitive assembly 10.

Figure 8A:
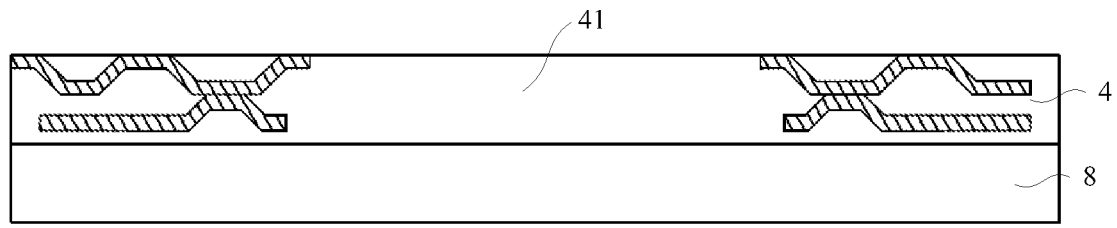
FIGS. 8a to 8e show a process for manufacturing a photosensitive assembly 10 in another embodiment of the present application.

In an embodiment, step 1000 includes the following sub-steps 1001-1005: Step 1001, forming a first re-wiring layer 4 corresponding to two photosensitive chips 1 on a bearing plate 8. FIG. 8a shows an example of forming a first re-wiring layer 4 corresponding to photosensitive chips on a bearing plate 8 in an embodiment of the present application. The first re-wiring layer 4 has a light-passing hole forming region 41 corresponding to the photosensitive region 13, and no wiring is performed in the light-passing hole forming region 41. A part of a re-wiring line of the first re-wiring layer 4 extends to an edge of the first re-wiring layer 4, and is exposed on a side surface of the first re-wiring layer 4.

Figure 8B:
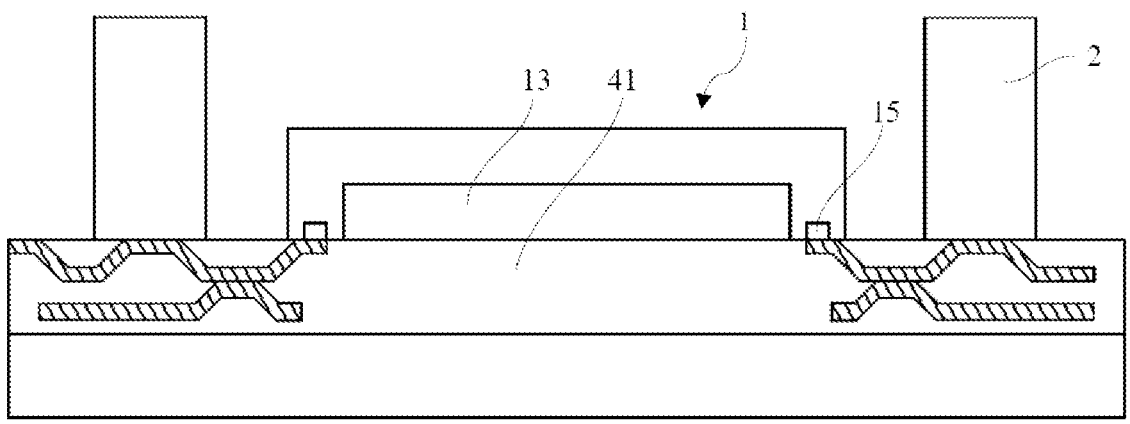

Step 1002, disposing a photosensitive chip 1 and a corresponding electronic element 2 on the first re-wiring layer 4. FIG. 8b shows an example in which a photosensitive chip 1 and a corresponding electronic element 2 are disposed on the first re-wiring layer 4 in an embodiment of the present application. The electronic element 2 is electrically connected to a pad 15 of the photosensitive chip 1 through the first re-wiring layer 4.

Figure 8C:
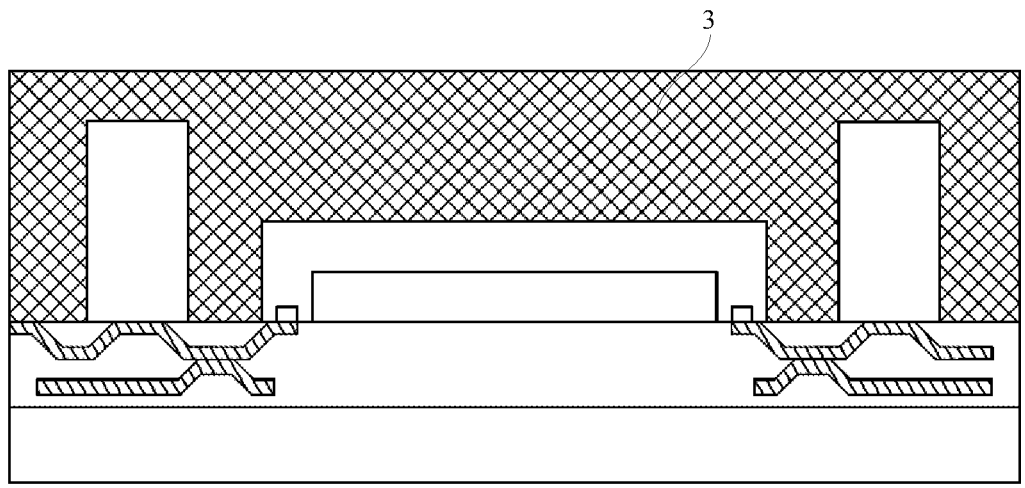

Step 1003, fixing the first re-wiring layer, the photosensitive chip and the electronic element together by a molding process. FIG. 8c shows an example of fixing the first re-wiring layer 4, the photosensitive chip 1 and the electronic element 2 together by a molding process in an embodiment of the present application.

Figure 8D:
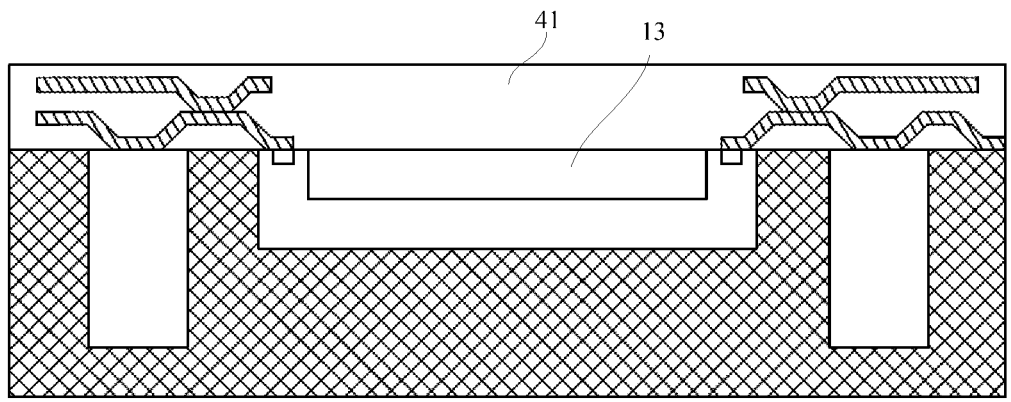

Step 1004, removing the bearing plate 8. FIG. 8d shows an example of removing the bearing plate 8 in an embodiment of the present application.

Step 1005, removing the light-passing hole forming region 41 of the first re-wiring layer 4 to expose the photosensitive region 13 of the photosensitive chip 1.

Further, the step 2000 is executed, that is, a conductive region 5 is formed by plating a metal layer on the side surface of the molded layer 3 and the side surface of the re-wiring layer to obtain a finished photosensitive assembly 10.

Figure 8E:
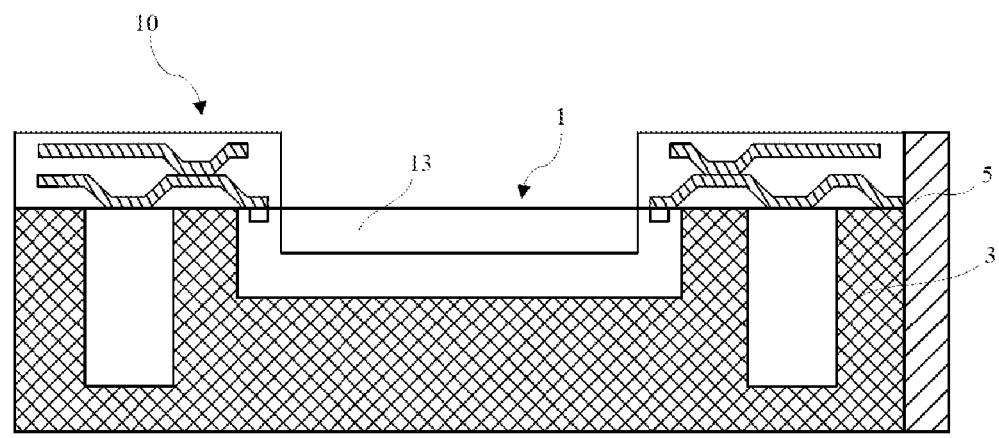

FIG. 8e shows an example of a finished photosensitive assembly 10 according to an embodiment of the present application.

Further, in another embodiment, step 1000 may further include a sub-step 1003a: forming a second re-wiring layer on an upper surface of the molded layer 3 formed in step 1003. A part of a re-wiring line of the second re-wiring layer extends to an edge of the second re-wiring layer, and is exposed on a side surface of the second re-wiring layer.

In step 2000, the re-wiring layer may be a first re-wiring layer or a second re-wiring layer. When a part of a re-wiring line of the first re-wiring layer is exposed on the side surface of the first re-wiring layer, said re-wiring layer refers to the first re-wiring layer. When a part of a re-wiring line of the second re-wiring layer is exposed on the side surface of the second re-wiring layer, said re-wiring layer refers to the second re-wiring layer.

In steps 1000-2000, the conventional fan-out process is first performed, but the difference is that the circuit of the RDL layer needs to be exposed on the side surface, so that the conductive layer can be electrically connected to the RDL layer when the conductive layer is subsequently plated. At the same time, the advantage of this solution is that the shape of the conductive region can be set arbitrarily, thereby satisfying different customer demands. In an embodiment, the bearing plate may be removed after step 1003 is completed and before step 2000 is executed. In another embodiment, the bearing plate may also be removed after step 2000 is completed.

Further, in another embodiment, step 1005 (i.e. the step of removing the light-passing hole forming region of the first re-wiring layer 4) may also be executed after step 2000. In still another embodiment, step 1005 may also be executed between step 1001 and step 1002, and at this time, the first re-wiring layer does not completely cover the bearing plate. The bearing plate has a blank region thereon, the blank region corresponding to the photosensitive region of the photosensitive chip, and the blank region being not covered by the first re-wiring layer.

The above description is only the preferred implementations of the present application and the explanation of the applied technical principle. It should be understood by those skilled in the art that the scope involved in the present application is not limited to technical solutions formed by specific combinations of the above technical features, and at the same time, should also cover other technical solutions formed by any combination of the above technical features or equivalent features thereof without departing from the concept of the disclosure. For example, the above features and (but not limited to) the technical features with similar functions disclosed in the present application are replaced with each other to form technical solutions.

The invention claimed is:

1. A photosensitive assembly, comprising:
   a photosensitive chip having a first surface and a second surface facing away from the first surface, the first surface having a photosensitive region and a non-photosensitive region, and the photosensitive chip further having a pad disposed in the non-photosensitive region;
   an electronic element arranged around the photosensitive chip;
   a molded portion formed by a molding process and packaging the electronic element and the photosensitive chip together, the molded portion having a third surface flush with the first surface; and
   a first re-wiring layer formed on the non-photosensitive region of the first surface and on the third surface, the pad being electrically connected to the electronic element through the first re-wiring layer;
   wherein a side surface of the photosensitive assembly has a conductive region, and the conductive region is electrically connected to the first re-wiring layer;
   wherein a re-wiring line of the first re-wiring layer extends to an edge of the first re-wiring layer and is exposed on a side surface of the first re-wiring layer; and the conductive region is formed by plating a metal layer on a side surface of the molded portion and the side surface of the first re-wiring layer.

2. The photosensitive assembly according to claim 1, wherein the molded portion is a molded layer, and the molded layer covers the second surface to form a fourth surface facing away from the third surface; and
   the photosensitive assembly further comprises:
   a second re-wiring layer formed on the fourth surface.

3. The photosensitive assembly according to claim 2, wherein the conductive region is electrically connected to the first re-wiring layer; and the conductive region is further electrically connected to the second re-wiring layer.

4. The photosensitive assembly according to claim 2, wherein the conductive region is formed by cutting a conductive pillar disposed on a boundary between two adjacent photosensitive assemblies.

5. A manufacturing method of photosensitive assembly, comprising:
   a) manufacturing the photosensitive assembly according to claim 2, wherein a part of a re-wiring line of a re-wiring layer of the photosensitive assembly extends to an edge of the re-wiring layer, and is exposed on a side surface of the re-wiring layer, and wherein the re-wiring layer is the first re-wiring layer; and
   b) forming the conductive region by plating a metal layer on a side surface of the molded layer and the side surface of the re-wiring layer.

6. The manufacturing method of photosensitive assembly according to claim 5, wherein the step a) comprises the following sub-steps:
   a.1) forming the first re-wiring layer corresponding to the photosensitive chip on a bearing plate;
   a.2) disposing the photosensitive chip and the electronic element on the first re-wiring layer, wherein the electronic element is electrically connected to the pad of the photosensitive chip through the first re-wiring layer; and
   a.3) fixing the first re-wiring layer, the photosensitive chip and the electronic element together by the molding process.

7. The manufacturing method of photosensitive assembly according to claim 6, wherein in the step a.1), the bearing plate has a blank region corresponding to the photosensitive region of the photosensitive chip thereon, and the blank region is not covered by the first re-wiring layer.

8. The manufacturing method of photosensitive assembly according to claim 6, wherein in the step a.1), the first re-wiring layer has a light-passing hole forming region corresponding to the photosensitive region of the photosensitive chip, and no wiring is performed in the light-passing hole forming region; and
   the manufacturing method of photosensitive assembly further comprises a step of:
   c) removing the light-passing hole forming region.

9. The manufacturing method of photosensitive assembly according to claim 6, wherein in the step a.1), a part of the re-wiring line of the first re-wiring layer extends to the edge of the first re-wiring layer, and is exposed on the side surface of the first re-wiring layer; and
   in the step b), the conductive region is formed by plating the metal layer on the side surface of the molded layer and the side surface of the first re-wiring layer.

10. The manufacturing method of photosensitive assembly according to claim 6, wherein:
    the step a) further comprises a sub-step of:
    a.4) forming the second re-wiring layer on a surface of the molded layer formed in step a.3) facing away from the bearing plate.

11. A photosensitive assembly, comprising:
    a photosensitive chip having a first surface and a second surface facing away from the first surface, the first surface having a photosensitive region and a non-photosensitive region, and the photosensitive chip further having a pad disposed in the non-photosensitive region;
    an electronic element arranged around the photosensitive chip;
    a molded layer formed by a molding process and fixing the electronic element and the photosensitive chip together, the molded layer having a third surface flush with the first surface, and the molded layer covering the second surface to form a fourth surface facing away from the third surface;

a first re-wiring layer formed on the non-photosensitive region of the first surface and on the third surface, the pad being electrically connected to the electronic element through the first re-wiring layer; and wherein a re-wiring line of the first re-wiring layer extends to an edge of the first re-wiring layer and is exposed on a side surface of the first re-wiring layer; and the conductive region is formed by plating a metal layer on a side surface of the molded portion and the side surface of the first re-wiring layer.

12. A manufacturing method of photosensitive assembly, comprising:
  a) manufacturing a photosensitive assembly spliced board, the photosensitive assembly spliced board being composed of at least two photosensitive assembly units, each of the at least two photosensitive assembly units comprising:
    a photosensitive chip having a first surface and a second surface facing away from the first surface, the first surface having a photosensitive region and a non-photosensitive region, and the photosensitive chip further having a pad disposed in the non-photosensitive region;
    an electronic element arranged around the photosensitive chip; and
    a molded layer formed by a molding process and packaging the electronic element and the photosensitive chip together, the molded layer having a third surface flush with the first surface;
    wherein a first re-wiring layer formed on the non-photosensitive region of the first surface and on the third surface of each of the at least two photosensitive assembly units, each pad being electrically connected to each electronic element through the first re-wiring layer;
    wherein the molded layer of each of two adjacent photosensitive assembly units of the at least two photosensitive assembly units is connected to one another to form a whole, and a conductive pillar is provided at a position of a boundary of the two adjacent photosensitive assembly units of the at least two photosensitive assembly units, the conductive pillar being wrapped in the molded layers forming a whole; and
  b) cutting the photosensitive assembly spliced board at the boundary, so that the conductive pillar is cut open, and thereby a side surface of each of the molded layers obtained by cutting has a conductive region.

13. The manufacturing method of photosensitive assembly according to claim 12, wherein the step a) comprises:
  a.1) forming the first re-wiring layer, corresponding to at least two photosensitive chips, on a bearing plate, wherein the at least two photosensitive chips include the photosensitive chip of each of the at least two photosensitive assembly units;
  a.2) disposing the at least two photosensitive chips and corresponding electronic elements, as well as the conductive pillar located between two adjacent photosensitive chips of the at least two photosensitive chips, on the first re-wiring layer, wherein the corresponding electronic elements and the conductive pillar are each electrically connected to the pad of the respective photosensitive chip through the first re-wiring layer; and
  a.3) fixing the first re-wiring layer, the at least two photosensitive chips, the corresponding electronic elements and the conductive pillar together by the molding process so as to form the photosensitive assembly spliced board.

14. The manufacturing method of photosensitive assembly according to claim 13, wherein in the step a.1), the first re-wiring layer has a light-passing hole forming region corresponding to the photosensitive region, and no wiring is performed in the light-passing hole forming region; and
  the manufacturing method of photosensitive assembly further comprises a step of:
    c) removing the light-passing hole forming region from the first re-wiring layer.

15. The manufacturing method of photosensitive assembly according to claim 13, wherein
  the step a.2) further comprises disposing a conductive core body on the first re-wiring layer;
  the step a.3) further comprises molding the conductive core body and the first re-wiring layer, the two adjacent photosensitive chips of the at least two photosensitive chips and the corresponding electronic elements together; and
  the step a) further comprises a sub-step of:
    a.4) forming a second re-wiring layer on a surface of the molded layer formed in the step a.3) facing away from the bearing plate to form the photosensitive assembly spliced board.

16. The manufacturing method of photosensitive assembly according to claim 12, wherein the step a) comprises:
  a.1) arranging the photosensitive chip of each of the at least two photosensitive assembly units, the electronic element of each of the at least two photosensitive assembly units, and the conductive pillar on a bearing plate;
  a.2) fixing the at least two photosensitive chips, the electronic elements and the conductive pillar together by the molding process to form one package body; and
  a.3) disposing the first re-wiring layer on the package body, so that the electronic elements and the conductive pillar are each electrically connected to the pad of the respective photosensitive chip through the first re-wiring layer to obtain the photosensitive assembly spliced board.

* * * * *